United States Patent
Jeong et al.

(10) Patent No.: US 10,050,565 B2
(45) Date of Patent: *Aug. 14, 2018

(54) PIEZOELECTRIC ENERGY HARVESTER AND WIRELESS SWITCH INCLUDING THE SAME

(71) Applicant: SAMSUNG ELECTRO-MECHANICS CO., LTD., Suwon-si (KR)

(72) Inventors: In Wha Jeong, Suwon-si (KR); Jong Heum Park, Suwon-si (KR); Hugh Kim, Suwon-si (KR)

(73) Assignee: Samsung Electro-Mechanics Co., Ltd., Suwon-si (KR)

(*) Notice: Subject to any disclaimer, the term of this patent is extended or adjusted under 35 U.S.C. 154(b) by 434 days.

This patent is subject to a terminal disclaimer.

(21) Appl. No.: 14/842,232

(22) Filed: Sep. 1, 2015

(65) Prior Publication Data

US 2016/0065095 A1 Mar. 3, 2016

(30) Foreign Application Priority Data

Sep. 1, 2014 (KR) .................. 10-2014-0115722
Apr. 22, 2015 (KR) .................. 10-2015-0056710

(51) Int. Cl.
  *H02N 2/18* (2006.01)
  *H05B 37/02* (2006.01)
  *H01L 41/113* (2006.01)

(52) U.S. Cl.
  CPC ............. *H02N 2/18* (2013.01); *H05B 37/02* (2013.01); *H01H 2239/076* (2013.01);
  (Continued)

(58) Field of Classification Search
  CPC ................................ H02N 2/18; H05B 37/02
  See application file for complete search history.

(56) References Cited

U.S. PATENT DOCUMENTS 9,461,237 B2 * 10/2016 Ueno .................. H01L 41/125
2007/0211577 A1    9/2007 Chan
(Continued)

FOREIGN PATENT DOCUMENTS

CN   101034889 A    9/2007
CN   101330262 A   12/2008
(Continued)

OTHER PUBLICATIONS

Chinese Office Action dated Feb. 28, 2017 in counterpart Chinese Patent Application No. 201510552763.1 (10 pages, with English translation).

(Continued)

*Primary Examiner* — J. San Martin
(74) *Attorney, Agent, or Firm* — NSIP Law

(57) ABSTRACT

Provided are a piezoelectric energy harvester and a wireless switch including a piezoelectric energy harvester. The piezoelectric energy harvester uses energy generated in the piezoelectric energy harvester as driving power, thereby transmitting communications signals to an external lighting device using this driving power. Furthermore, the piezoelectric energy harvester generates power having different magnitudes depending on magnitudes of external force applied to a pressing member by a user or duration of the external force. A transmitting module of the wireless switch transmits signals that may adjust intensity of light to the external lighting device depending on the magnitudes of the generated power.

17 Claims, 4 Drawing Sheets

(52) U.S. Cl.
CPC ...... *H01H 2300/03* (2013.01); *H01L 41/1136* (2013.01); *Y02B 90/224* (2013.01); *Y04S 20/14* (2013.01)

(56) References Cited

U.S. PATENT DOCUMENTS

| | | | |
|---|---|---|---|
| 2007/0252479 A1 | 11/2007 | Ishikawa | |
| 2010/0117607 A1* | 5/2010 | Mochida | H02K 7/1876 322/99 |
| 2011/0215590 A1* | 9/2011 | Arnold | H02K 7/1892 290/1 R |
| 2013/0207520 A1* | 8/2013 | Near | H01L 41/1134 310/339 |
| 2013/0341936 A1 | 12/2013 | Wood et al. | |
| 2014/0097709 A1 | 4/2014 | Ueno et al. | |
| 2015/0303835 A1* | 10/2015 | Katsumura | H01L 41/1136 310/329 |
| 2016/0197261 A1* | 7/2016 | Abdelkefi | H01L 41/1136 310/312 |
| 2016/0294308 A1* | 10/2016 | Chen | H02N 2/18 |
| 2017/0163179 A1* | 6/2017 | Yoo | H02N 2/186 |

FOREIGN PATENT DOCUMENTS

| | | | | |
|---|---|---|---|---|
| CN | 101595626 A | | 12/2009 | |
| CN | 101866768 A | | 10/2010 | |
| CN | 103534925 A | | 1/2014 | |
| JP | 2001-35339 A | | 2/2001 | |
| JP | 2006-67643 A | | 3/2006 | |
| JP | 2006-158113 A | | 6/2006 | |
| JP | 2013-187928 A | | 9/2013 | |
| JP | 2016213971 A | * | 12/2016 | ............ H02K 35/02 |
| KR | 10-2014-0007238 A | | 1/2014 | |
| WO | WO 2008/020431 A2 | | 2/2008 | |
| WO | WO 2012/157246 A1 | | 11/2012 | |

OTHER PUBLICATIONS

Chinese Office Action dated Mar. 1, 2017 in counterpart Chinese Patent Application No. 201510552839.0 (10 pages, with English translation).

Korean Office Action dated Jul. 22, 2016 in counterpart Korean Patent Application No. 10-2015-0056710 (9 pages, with English translation).

* cited by examiner

PIEZOELECTRIC ENERGY HARVESTER AND WIRELESS SWITCH INCLUDING THE SAME

CROSS-REFERENCE TO RELATED APPLICATION(S)

This application claims the benefit under 35 USC 119(a) of Korean Patent Application Nos. 10-2014-0115722 and 10-2015-0056710 filed on Sep. 1, 2014 and Apr. 22, 2015, respectively, in the Korean Intellectual Property Office, the entire disclosures of which are incorporated herein by reference for all purposes.

BACKGROUND

1. Field

The following description relates to a piezoelectric energy harvester and a wireless switch including the same.

2. Description of Related Art

Generally, a lighting device is turned on or off by a switch. Since the switch is required to be disposed in a position reachable by a user, the switch is generally positioned on a wall of a building. Therefore, a power line applied to such a switch is formed inside of the wall of the building.

When the user turns on or off the lighting device, the user moves to be directly next to the wall on which the switch is formed and manually manipulates the switch to turn on or off the lighting device. However, this scheme is inconvenient because of the requirement for direct manual manipulation. Hence, it may be difficult for a user to identify his or her surroundings after the lighting device is turned off at night, causing an inconvenience in manipulation of the switch.

Therefore, a wireless switch device has been suggested in order to solve the inconvenience of the requirement for manual manipulation as described above and to allow for improved user convenience in turning lighting devices on and off.

When a user manipulates a transmitting unit of a remote control device, or the like, which is a wireless switch device, a lighting device control signal is wirelessly transmitted from the remote control device, and a receiving unit provided in the wall surface receives the wireless signal to turn on or off the lighting device. Such an approach provides improved convenience.

Since a battery, or a similar source of electric energy, is embedded in the transmitting unit of the remote control device, the battery needs to be periodically replaced, which is inconvenient.

SUMMARY

This Summary is provided to introduce a selection of concepts in a simplified form that are further described below in the Detailed Description. This Summary is not intended to identify key features or essential features of the claimed subject matter, nor is it intended to be used as an aid in determining the scope of the claimed subject matter.

An aspect of the present examples provides a piezoelectric energy harvester capable of providing driving power to a transmitting module included in a wireless switch, and a wireless switch including the same.

An aspect of the present examples also provides a piezoelectric energy harvester capable of allowing an external lighting device to adjust intensity of light, and a wireless switch including the same.

According to an aspect of the present examples, a piezoelectric energy harvester and a wireless switch including the same use energy generated in the piezoelectric energy harvester as driving power, thereby transmitting communications signals to an external lighting device.

In addition, the piezoelectric energy harvester generates power having different magnitudes depending on magnitudes of external force applied to a pressing member by a user or duration of the external force, and a transmitting module of the wireless switch transmits signals that adjust intensity of light to the external lighting device depending on magnitudes of the generated power.

In one general aspect, a piezoelectric energy harvester includes a plate that is elastically deformable, a piezoelectric element situated on the plate, a magnet situated to be spaced apart from the plate, an insulator situated to movable to allow a magnetic force of the magnet to have an influence on the plate or to block the magnetic force of the magnet from acting on the plate, and a pressing member connected to the insulator to move the insulator, wherein the insulator moves along with the pressing member.

The insulator may entirely cover the magnet with respect to the plate in response an external force not being applied to the pressing member.

An area of the magnet that is covered by the insulator may be determined based on a magnitude of the external force that is applied to the pressing member.

An area of the magnet covered by the insulator may be determined based on a duration of the external force applied to the pressing member.

The pressing member may include a manipulator connected to the insulator, a fixed plate situated between the insulator and the manipulator and having an insertion hole into which the manipulator is inserted, and an elastic body that elastically supports the manipulator.

The insulator may move in response to an external force applied to the manipulator.

A movement distance of the insulator may correspond to a movement distance of the manipulator.

The manipulator may be inserted into one side of the insertion hole and may be limited in its external protrusion from the insertion hole through the other side of the insertion hole.

The pressing member further includes a connection member that penetrates through the insertion hole and that is fixed to the manipulator and to the insulator.

The plate may be formed of a magnetic material or of a metal.

One end of the plate may be a fixed end, and the other end of the plate may be a free end.

The magnet may be situated to face a portion of the plate adjacent to the other end of the plate.

The piezoelectric energy harvester may further include a support to which one end of the plate is fixed.

In another general aspect, a wireless switch includes a piezoelectric energy harvester including a plate that is elastically deformable, a piezoelectric element situated on the plate, a magnet situated to be spaced apart from the plate, an insulator situated to movable to allow a magnetic force of the magnet to have an influence on the plate or to block the magnetic force of the magnet from acting on the plate, and a pressing member connected to the insulator to move the insulator, wherein the insulator moves along with the pressing member, a rectifier that rectifies alternating current (AC) power generated in the piezoelectric energy harvester into direct current (DC) power to output the rectified power, a power controller that receives the rectified power to convert the received power to power having a preset voltage value, and a transmitting module that receives the power from the power controller to generate communications signals and transmit the communications signals.

The insulator may entirely cover the magnet with respect to the plate in response to an external force not being applied to the pressing member.

An area of the magnet that is covered by the insulator may be determined based on a magnitude of the external force that is applied to the pressing member.

An area of the magnet covered by the insulator is determined based on a duration of the external force applied to the pressing member.

Other features and aspects will be apparent from the following detailed description, the drawings, and the claims.

BRIEF DESCRIPTION OF THE DRAWINGS

Throughout the drawings and the detailed description, the same reference numerals refer to the same elements. The drawings may not be to scale, and the relative size, proportions, and depiction of elements in the drawings may be exaggerated for clarity, illustration, and convenience.

DETAILED DESCRIPTION

The following detailed description is provided to assist the reader in gaining a comprehensive understanding of the methods, apparatuses, and/or systems described herein. However, various changes, modifications, and equivalents of the methods, apparatuses, and/or systems described herein will be apparent to one of ordinary skill in the art. The sequences of operations described herein are merely examples, and are not limited to those set forth herein, but may be changed as will be apparent to one of ordinary skill in the art, with the exception of operations necessarily occurring in a certain order. Also, descriptions of functions and constructions that are well known to one of ordinary skill in the art may be omitted for increased clarity and conciseness.

The features described herein may be embodied in different forms, and are not to be construed as being limited to the examples described herein. Rather, the examples described herein have been provided so that this disclosure will be thorough and complete, and will convey the full scope of the disclosure to one of ordinary skill in the art.

Figure 1:
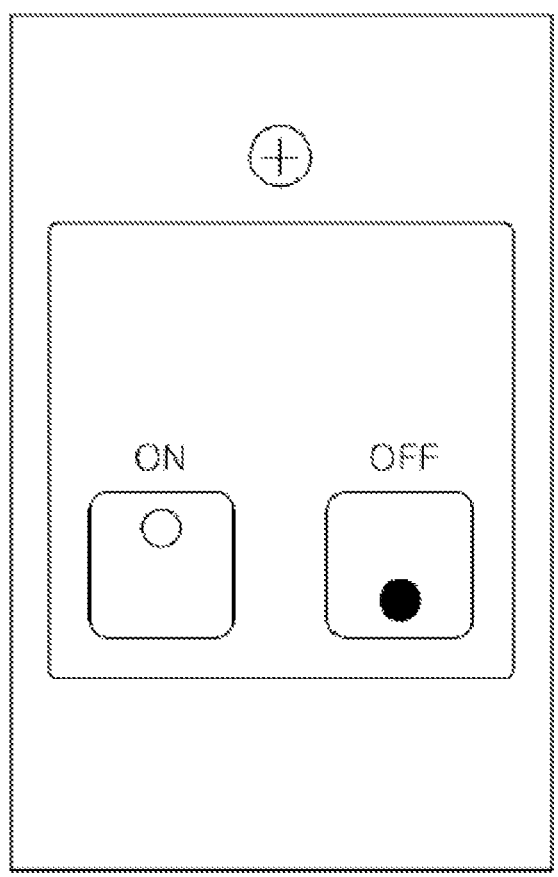
FIG. 1 is a plan view of a wireless switch according to an example.
Figure 2:
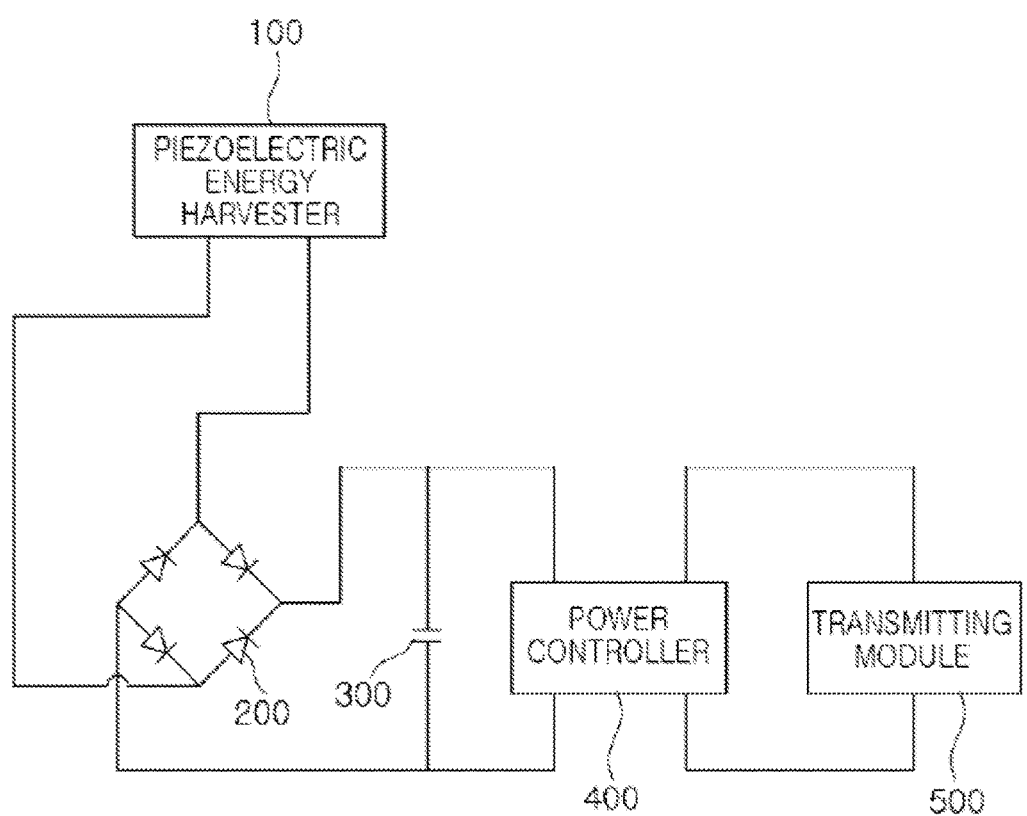
FIG. 2 is a schematic view of a wireless switch according to an example.

FIG. 1 is a plan view of a wireless switch according to an example; and FIG. 2 is a schematic view of the wireless switch according to an example.

Referring to FIGS. 1 and 2, the wireless switch, according to the example of FIGS. 1 and 2, includes a piezoelectric energy harvester 100, a rectifier 200, a capacitor 300, a power controller 400, and a transmitting module 500.

ON and OFF buttons illustrated in FIG. 1 are provided in a structure in which they are pressed by a user to generate power in the piezoelectric energy harvester 100. Here, the piezoelectric energy harvester 100 uses the piezoelectric effect to convert a mechanical force into electrical energy. For example, the ON and OFF buttons are each a pressing member 160.

In addition, a magnitude of the power generated in the piezoelectric energy harvester 100 changes depending on a magnitude of external force applied to the pressing member 160 and/or duration of the external force. For example, a larger or longer-lasting force potentially generates more power. Aspects of how much energy is generated are described below with reference to FIGS. 3 through 6.

For example, alternating current (AC) power generated in the piezoelectric energy harvester 100 is rectified into direct current (DC) power through the rectifier 200 and is then stored in the capacitor 300.

The rectified power supplied from the capacitor 300 is converted into power having a preset voltage value through the power controller 400 and is then transmitted to the transmitting module 500.

Here, power having various voltage values depending on a magnitude of the rectified power is transmitted to an input side of the power controller 400.

The transmitting module 500 generates communications signals through the power received from the power controller 400. The communications signals are transmitted to a receiving module of an external lighting device.

That is, the wireless switch, according to an example, uses energy generated in the piezoelectric energy harvester 100 as driving power of the transmitting module 500, thereby transmitting turn-on/off signals to the external lighting device.

Therefore, a wireless control system is easily built without using mechanically complicated components in order to connect a switch to a lighting device, or the like, in a home using a simpler, improved approach.

In addition, the wireless switch, according to an example, transmits signals for turning on or off the lighting device without including a separate battery embedded therein.

In addition, since the transmitting module 500 receives the power having various voltage values from the input side of the power controller 400, the transmitting module 500 generates different communications signals depending on a magnitude of the received power, and the external lighting device analyzes the received communications signals to emit light having different intensities.

Therefore, the wireless switch, according to an example, transmits various communications signals through which the external lighting device adjusts intensity of light.

Next, a configuration of the piezoelectric energy harvester 100 according to an example of generating energy to be used as driving power of the transmitting module 500 is described with reference to the examples of FIGS. 3 through 6.

Figure 3:
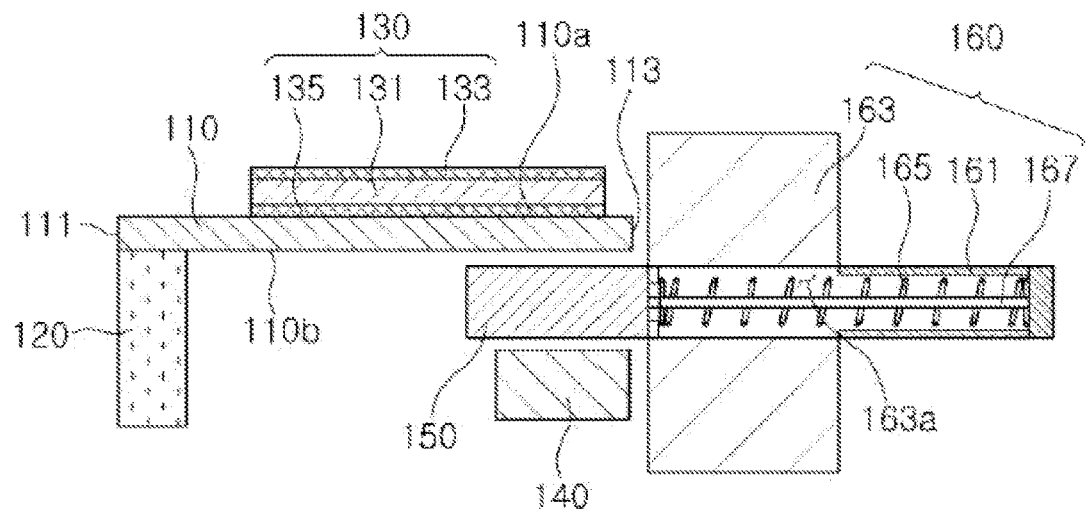
FIG. 3 is a view illustrating a piezoelectric energy harvester according to an example.
Figure 4:
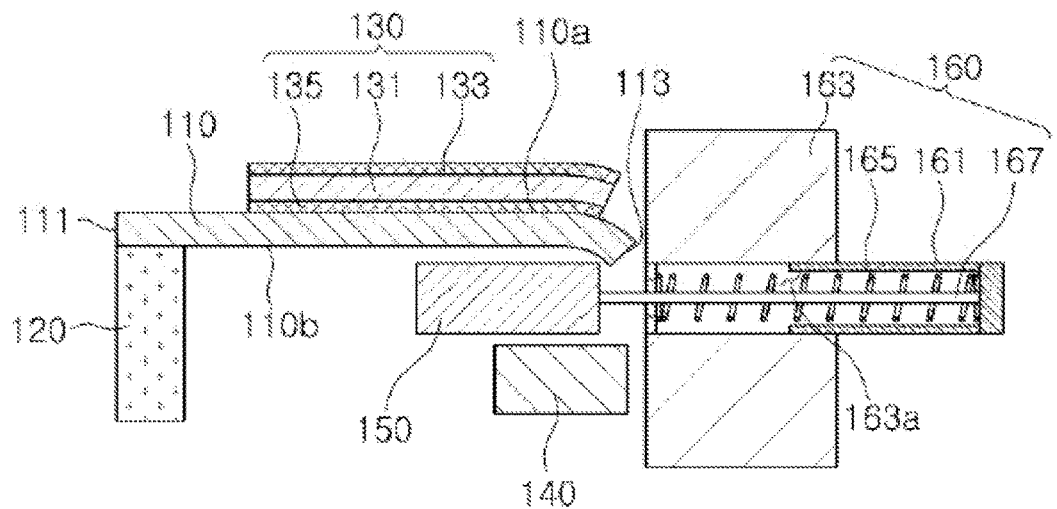
FIGS. 4 through 6 are views illustrating a manner in which energy is generated in the piezoelectric energy harvester according to an example.
Figure 5:
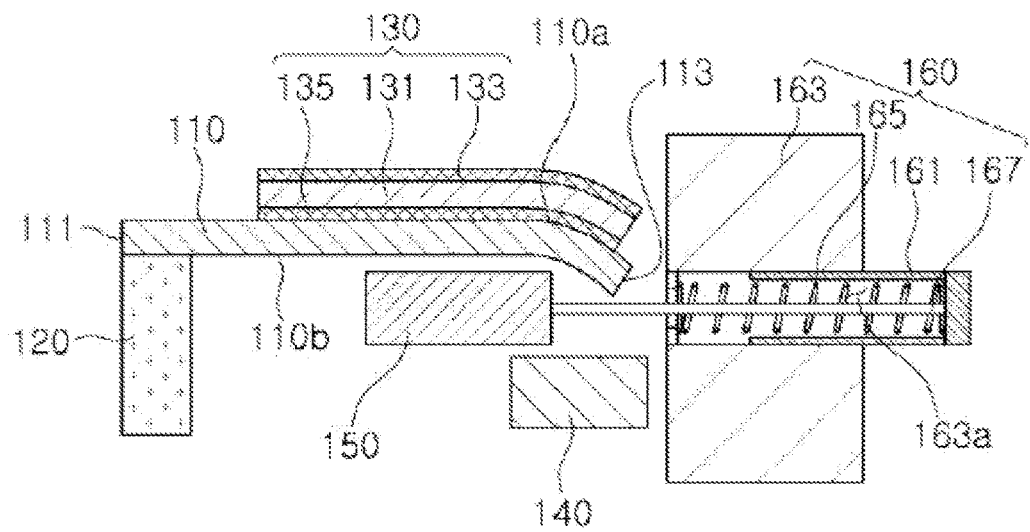
Figure 6:
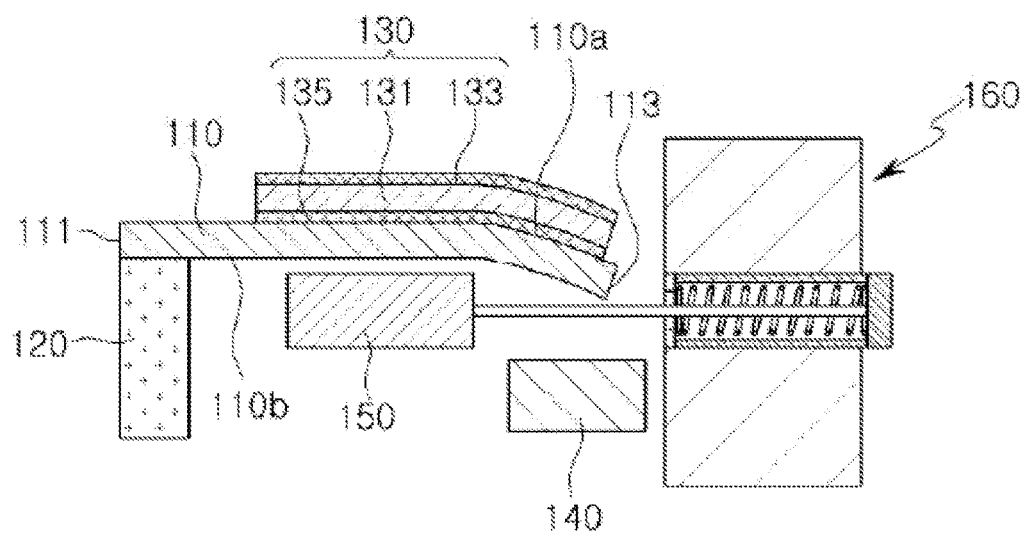

FIG. 3 is a view illustrating a piezoelectric energy harvester according to an example; and FIGS. 4 through 6 are views illustrating a manner in which energy is generated in the piezoelectric energy harvester according to an example.

First, referring to FIG. 3, the piezoelectric energy harvester 100, according to an example, includes a plate 110, a support 120 supporting the plate 110, a piezoelectric element 130 disposed on the plate 110, a magnet 140 generating displacement in the plate 110, an insulator 150 disposed between the plate 110 and the magnet 140, and a pressing member 160 moving the insulator 150.

The plate 110 is formed of a material that is able to be elastically deformed.

The support 120 supports one end 111 of the plate 110. That is, one end 111 of the plate 110 is a fixed end fixed to the support 120, and the other end 113 of the plate 110 is a free end.

In one example, the plate 110 has a cantilever shape in which one end 111 of the plate is fixed to the support 120.

For example, the plate 110 has rigidity sufficient to be maintained to be flat in a case in which external force is not applied to the plate 110, and is displaced in a case in which external force is applied to the plate 110.

Here, the plate 110 is formed of a magnetic material or a metal, and the external force applied to the plate 110 is a magnetic attractive force generated between the magnetic 140 and the plate 110. It is to be recognized that a variety of magnetic materials and/or metals are appropriate candidate materials for the material used to form the plate.

That is, in this example, the plate 110 is elastically deformed by the magnetic force of the magnet 140.

Even if an impact is not directly applied to the plate 110, the displacement is generated in the plate 110 by the magnetic force of the magnet 140. Therefore, a durability of the piezoelectric energy harvester and the wireless switch including the same, according to an example, are improved.

The piezoelectric element 130 is disposed on one surface 110a of the plate 110. For example, the piezoelectric element 130 includes a piezoelectric body 131, a first electrode 133 disposed on one surface of the piezoelectric body 131, and a second electrode 135 disposed on the other surface of the piezoelectric body 131.

Therefore, when the displacement is generated in the plate 110, displacement is also generated in the piezoelectric element 130, and thus a piezoelectric effect resulting from a potential difference occurs.

For example, when the displacement is generated in the plate 110, the displacement is also generated in the piezoelectric element 130 disposed on the plate 110, and thus electrical polarization is generated in the piezoelectric element 130.

Therefore, voltage is generated in the first electrode 133 and the second electrode 135 provided on one surface and the other surface of the piezoelectric body 131, and output current generated through the voltage is used as driving power of the transmitting module 500.

For example, the piezoelectric body 131 is formed of lead zirconate titanate, barium titanate ($BaTiO_3$), lead titanate ($PbTiO_3$), lithium niobate ($LiNbO_3$), silicon dioxide ($SiO_2$), or the like. However, these are merely examples, and other appropriate materials are potentially used to form the piezoelectric body 131.

The second electrode 135 is provided in order to generate a potential difference, and is disposed on the other surface of the piezoelectric body 131 so as to correspond to the first electrode 133.

The magnet 140 is disposed to be spaced apart from the plate 110. For example, the magnet 140 is disposed to be spaced apart from the other surface 110b of the plate 110, which is the opposite of one surface 110a of the plate 110 on which the piezoelectric element 130 is disposed.

In addition, the magnet 140 is disposed to face the other surface 110b of the plate 110 positioned adjacently to the other end 113 of the plate 110.

Therefore, the other end 113 of the plate 110 is bent toward the magnet 140 by the magnetic force of the magnet 140. That is, displacement is generated in a portion of the plate 110 adjacent to the other end 113 of the plate 110.

The insulator 150 is disposed between the plate 110 and the magnet 140 and serves to block the magnetic force of the magnet 140 acting on the plate 110.

Therefore, the magnetic attractive force does not act between the plate 110 and the magnet 140 due to the insulator 150.

Since the magnetic force of the magnet 140 acting on the plate 110 is blocked by the insulator 150, the plate 110 is not affected by the magnetic force of the magnet 140. Therefore, the external force does not act on the plate 110.

Accordingly, in this case, the plate 110 is maintained to be flat.

Here, as illustrated in FIG. 4, the insulator 150 is movably disposed between the plate 110 and the magnet 140.

Therefore, when the insulator 150 covering the magnet 140 moves, the magnet 140 and the plate 110 directly face each other, and thus the magnetic force of the magnet 140 has an influence on the plate 110.

Therefore, the magnetic attractive force is generated between the plate 110 and the magnet 140, and thus the displacement is generated in the plate 110.

Thus, it is determined whether or not the magnetic attractive force acts between the plate 110 and the magnet 140 depending on a position of the insulator 150.

For example, as illustrated in FIG. 3, in a case in which the insulator 150 entirely covers the magnet 140, the magnetic attractive force does not act between the plate 110 and the magnet 140.

However, as illustrated in FIGS. 4 through 6, in a case in which the magnet 140 partially or entirely faces the plate 110 due to movement of the insulator 150, the magnetic attractive force acts between the plate 110 and the magnet 140.

The pressing member 160 moves the insulator 150.

For example, referring to FIG. 3, the pressing member 160 includes a manipulator 161 connected to the insulator 150, a fixed plate 163 disposed between the insulator 150 and the manipulator 161 and having an insertion hole 163a into which the manipulator 161 is insertable, and an elastic body 165 elastically supporting the manipulator 161.

In addition, the pressing member 160 further includes a connection member 167 connecting the manipulator 161 and the insulator 150 to each other.

In the example of FIG. 3, the manipulator 161 is connected to the insulator 150 by the connection member 167. The connection member 167 penetrates through the insertion hole 163a, so that one end thereof is fixed to the insulator 150 and the other end thereof is fixed to the manipulator 161.

Therefore, the insulator 150 moves together with the pressing member 160.

As illustrated in FIG. 3, in a case in which external force is not applied to the pressing member 160, that is, in a case in which the pressing member 160 is in a stationary state, the insulator 150 entirely covers the magnet 140 with respect to the plate 110.

Therefore, the magnetic force of the magnet 140 does not have an influence on the plate 110, and thus the plate 110 is maintained to be flat.

However, as illustrated in FIGS. 4 through 6, in a case in which the insulator 150 moves together with the pressing member 160, the magnet 140 directly faces the plate 110. Therefore, the magnetic force of the magnet 140 has an influence on the plate 110, and thus the displacement is generated in the plate 110.

The manipulator 161 has a structure that is pressed by a user in order for the user to operate the piezoelectric energy harvester 100.

For example, the manipulator 161 is elastically supported by the elastic body 165 in a state in which it protrudes from the fixed plate 163.

When the user presses the manipulator 161, the manipulator 161 is inserted into the insertion hole 163a in a state in which it is elastically supported by the elastic body 165 while the elastic body 165 is being compressed.

For example, the shape of the insertion hole 163*a* corresponds to that of the manipulator 161.

Although a case in which the insertion hole 163*a* and the manipulator 161 have a cylindrical shape has been described for convenience of explanation in the present example, the insertion hole 163*a* and the manipulator 161 are not limited to having the cylindrical shape, and in examples have various shapes such as a polygonal shape. In examples, these elements optionally have any shape that is appropriate and does not conflict with their proper operation.

In an example, the insertion hole 163*a* has a diameter sufficient to allow the manipulator 161 to be inserted. Therefore, a diameter of a side, referred to as one side of the insertion hole 163*a*, of the insertion hole 163*a* adjacent to the manipulator 161 is equal to or larger than that of the manipulator 161.

However, a diameter of a side, referred to as the other side of the insertion hole 163*a*, of the insertion hole 163*a* adjacent to the insulator 150 is smaller than that of the manipulator 161.

That is, the diameter of the other side of the insertion hole 163*a* is smaller than that of one side of the insertion hole 163*a*.

Therefore, when the manipulator 161 is inserted into the insertion hole 163*a* and moved, the manipulator 161 is caught by the other side of the insertion hole 163*a*, and thus an insertion length of the manipulator 161 is limited.

That is, the manipulator 161 is inserted into one side of the insertion hole 163*a* to thereby be movable, and is limited in externally protruding from the insertion hole 163*a* through the other side of the insertion hole 163*a*.

Therefore, the other side of the insertion hole 163*a* serves as a stopper limiting the insertion length of the manipulator 161.

In such an example, the interior of the manipulator 161 is empty, and the elastic body 165 is disposed in the interior of the manipulator 161.

One end of the elastic body 165 is fixed to the side of the insertion hole 163*a* adjacent to the insulator 150, and the other end of the elastic body 165 is fixed to the manipulator 161.

Therefore, the manipulator 161 is elastically supported by the elastic body 165.

Here, when the user presses the manipulator 161, the manipulator 161 is moved so as to be inserted into the insertion hole 163*a*.

Since the insulator 150 is connected to the manipulator 161 by the connection member 167, the insulator 150 is also moved by a movement distance of the manipulator 161 depending on the movement of the manipulator 161.

A maximum movement distance of the insulator 150 is determined to the extent that that the magnet 140 entirely faces the plate 110.

For example, the insulator 150 moves toward the support 120 to which one end 111 of the plate 110 is fixed depending on the movement of the manipulator 161, and thus an effect of blocking the magnetic force of the magnet 140 acting on the plate 110 is released.

Therefore, the magnetic attractive force acts between the other end 113 of the plate 110 and the magnet 140, and thus the other end 113 of the plate 110 is bent toward the magnet 140.

That is, in this example, the displacement is generated at the portion of the plate 110 adjacent to the other end 113 of the plate 110.

Here, a displacement amount of the plate 110 is changed depending on a movement distance of the insulator 150.

For example, as illustrated in FIG. 4, in a case in which the movement distance of the insulator 150 is relatively small, only a portion of the magnet 140 faces the plate 110.

Therefore, in this case, since the magnetic force of the magnet 140 acting on the plate 110 is relatively small, a displacement amount of the plate 110 is also relatively small.

However, as illustrated in FIGS. 5 and 6, in a case in which the movement distance of the insulator 150 is relatively large, the magnetic force of the magnet 140 acting on the plate 110 becomes relatively large, and thus a displacement amount of the plate 110 also becomes relatively large.

Since a displacement amount of the piezoelectric element 130 is affected by the displacement amount of the plate 110, the larger the displacement amount of the plate 110, the larger the displacement amount of the piezoelectric element 130.

Since a magnitude of power generated in the piezoelectric element 130 is affected by the displacement amount of the piezoelectric element 130, the magnitude of the power generated in the piezoelectric element 130 is adjusted by adjusting the displacement amount of the plate 110.

The displacement amount of the plate 110 is changed depending on an area of the magnet 140 covered by the insulator 150, and the area of the magnet 140 covered by the insulator 150 is determined depending on the magnitude of the external force applied to the pressing member 160 or the duration of the external force.

Since a movement distance of the manipulator 161 is changed depending on the magnitude of the external force applied to the manipulator 161 or the duration of the external force, a movement distance of the insulator 150 moving together with the manipulator 161 is also affected accordingly by the magnitude of the external force applied to the manipulator 161 or the duration of the external force.

Therefore, in the piezoelectric energy harvester 100, according to an example, the displacement amount of the piezoelectric element 130 is changed depending on a magnitude of force at which the user presses the manipulator 161 or duration of the force.

When the displacement is generated at the portion of the plate 110 adjacent to the other end of the plate 110, a displacement corresponding to the displacement of the plate 110 is also generated in the piezoelectric element 130, and thus electrical polarization is generated in the piezoelectric element 130, thereby generating a voltage.

Therefore, in the piezoelectric energy harvester 100, according to an example, the piezoelectric element 130 is displaced using the magnetic attractive force between the plate 110 and the magnet 140 that is generated depending on the movement of the insulator 150, thereby generating power.

The power generated in the piezoelectric energy harvester 100 passes through the rectifier 200, the capacitor 300, and the power controller 400 and is used as the driving power of the transmitting module 500 generating the communications signals.

Here, since a magnitude of the power generated in the piezoelectric element 130 changes depending on the displacement amount of the plate 110, a magnitude of power input to the power controller 400 changes as well, and the transmitting module 500 transmits various communications signals depending on the magnitude of the input power.

Here, in an example, the various communications signals referred to above are communications signals through which the external lighting device adjusts intensity of light. However, this is only one example of the significance of the communications signals, and the communications signals are potentially used to signal different commands or instructions to a target device.

As described above, since the displacement amount of the plate 110 is adjusted by changing the magnetic attractive force generated between the plate 110 and the magnet 140, the magnitude of the power generated in the piezoelectric element 130 is adjusted in this manner.

Since the transmitting module 500 transmits various communications signals depending on the magnitude of the input power, the external lighting device adjusts the intensity of the light depending on received communications signals.

As set forth above, the piezoelectric energy harvester, according to an example, provides driving power to the transmitting module included in the wireless switch. Therefore, the wireless switch including the piezoelectric energy harvester, according to an example, transmits signals for turning on or off the lighting device without including a separate battery embedded therein. Such an approach improves the convenience and ease of use of a wireless switch.

In addition, the piezoelectric energy harvester and the wireless switch including the same, according to an example, transmit different communications signals depending on intensity of light desired by the user so that the external lighting device adjusts the intensity of the light according to providing different signals.

Unless indicated otherwise, a statement that a first layer is "on" a second layer or a substrate is to be interpreted as covering both a case where the first layer directly contacts the second layer or the substrate, and a case where one or more other layers are disposed between the first layer and the second layer or the substrate.

Words describing relative spatial relationships, such as "below", "beneath", "under", "lower", "bottom", "above", "over", "upper", "top", "left", and "right", may be used to conveniently describe spatial relationships of one device or elements with other devices or elements. Such words are to be interpreted as encompassing a device oriented as illustrated in the drawings, and in other orientations in use or operation. For example, an example in which a device includes a second layer disposed above a first layer based on the orientation of the device illustrated in the drawings also encompasses the device when the device is flipped upside down in use or operation.

While this disclosure includes specific examples, it will be apparent to one of ordinary skill in the art that various changes in form and details may be made in these examples without departing from the spirit and scope of the claims and their equivalents. The examples described herein are to be considered in a descriptive sense only, and not for purposes of limitation. Descriptions of features or aspects in each example are to be considered as being applicable to similar features or aspects in other examples. Suitable results may be achieved if the described techniques are performed in a different order, and/or if components in a described system, architecture, device, or circuit are combined in a different manner, and/or replaced or supplemented by other components or their equivalents. Therefore, the scope of the disclosure is defined not by the detailed description, but by the claims and their equivalents, and all variations within the scope of the claims and their equivalents are to be construed as being included in the disclosure.

What is claimed is:

1. A piezoelectric energy harvester comprising:
   a plate that is elastically deformable;
   a piezoelectric element situated on the plate;
   a magnet situated to be spaced apart from the plate;
   an insulator movably disposed to allow a magnetic force of the magnet to have an influence on the plate or to block the magnetic force of the magnet from acting on the plate; and
   a pressing member connected to the insulator to move the insulator,
   wherein the insulator moves along with the pressing member.

2. The piezoelectric energy harvester of claim 1, wherein the insulator entirely covers the magnet with respect to the plate in response to an external force not being applied to the pressing member.

3. The piezoelectric energy harvester of claim 2, wherein an area of the magnet that is covered by the insulator is determined based on a magnitude of the external force that is applied to the pressing member.

4. The piezoelectric energy harvester of claim 2, wherein an area of the magnet covered by the insulator is determined based on a duration of the external force applied to the pressing member.

5. The piezoelectric energy harvester of claim 1, wherein the pressing member comprises:
   a manipulator connected to the insulator;
   a fixed plate situated between the insulator and the manipulator and having an insertion hole into which the manipulator is inserted; and
   an elastic body that elastically supports the manipulator.

6. The piezoelectric energy harvester of claim 5, wherein the insulator moves in response to an external force applied to the manipulator.

7. The piezoelectric energy harvester of claim 6, wherein a movement distance of the insulator corresponds to a movement distance of the manipulator.

8. The piezoelectric energy harvester of claim 5, wherein the manipulator is inserted into one side of the insertion hole and is limited in its external protrusion from the insertion hole through the other side of the insertion hole.

9. The piezoelectric energy harvester of claim 5, wherein the pressing member further comprises a connection member that penetrates through the insertion hole and that is fixed to the manipulator and to the insulator.

10. The piezoelectric energy harvester of claim 1, wherein the plate is formed of a magnetic material or of a metal.

11. The piezoelectric energy harvester of claim 1, wherein one end of the plate is a fixed end, and
    the other end of the plate is a free end.

12. The piezoelectric energy harvester of claim 11, wherein the magnet is situated to face a portion of the plate adjacent to the other end of the plate.

13. The piezoelectric energy harvester of claim 1, further comprising a support to which one end of the plate is fixed.

14. A wireless switch comprising:
    a piezoelectric energy harvester comprising
        a plate that is elastically deformable,
        a piezoelectric element situated on the plate,
        a magnet situated to be spaced apart from the plate,
        an insulator movably disposed to allow a magnetic force of the magnet to have an influence on the plate or to block the magnetic force of the magnet from acting on the plate, and
        a pressing member connected to the insulator to move the insulator,
        wherein the insulator moves along with the pressing member;

a rectifier that rectifies alternating current (AC) power generated in the piezoelectric energy harvester into direct current (DC) power to output the rectified power;

a power controller that receives the rectified power to convert the received power to power having a preset voltage value; and a transmitting module that receives the power from the power controller to generate communications signals and transmit the communications signals.

15. The wireless switch of claim 14, wherein the insulator entirely covers the magnet with respect to the plate in response to an external force not being applied to the pressing member.

16. The wireless switch of claim 15, wherein an area of the magnet that is covered by the insulator is determined based on a magnitude of the external force that is applied to the pressing member.

17. The wireless switch of claim 15, wherein an area of the magnet covered by the insulator is determined based on a duration of the external force applied to the pressing member.

* * * * *